United States Patent [19]

Smith

[11] Patent Number: 4,464,736

[45] Date of Patent: Aug. 7, 1984

[54] IN-PACKAGE E²PROM REDUNDANCY

[75] Inventor: Stephen L. Smith, Tempe, Ariz.

[73] Assignee: Motorola, Inc., Schaumburg, Ill.

[21] Appl. No.: 421,748

[22] Filed: Sep. 23, 1982

[51] Int. Cl.³ .................. G11C 11/40; G11C 13/00
[52] U.S. Cl. .................................. 365/200; 365/210; 371/10
[58] Field of Search ............... 365/200, 210; 371/10

[56] References Cited

U.S. PATENT DOCUMENTS 4,363,111 12/1982 Heightley et al. ............ 365/210
4,393,474 7/1983 McElroy ..................... 365/210

*Primary Examiner*—Terrell W. Fears
*Attorney, Agent, or Firm*—William E. Koch

[57] ABSTRACT

An E²PROM redundant memory element is provided whereby faulty or improperly coded ROM or E²PROM elements may be replaced by the user in-package. An address programming element including an E²PROM floating gate device having a programmed mode, an unprogrammed mode, and an inhibit mode, may be programmed and erased in-package. Addresses received by the redundant memory element in addition to other inputs determine the mode of the floating gate device.

7 Claims, 2 Drawing Figures

4,464,736

IN-PACKAGE E²PROM REDUNDANCY

BACKGROUND OF THE INVENTION

1. Field of the Invention

This invention relates, in general, to the use of spare memory bits in large memory devices and more particularly to in-package electrically programmable redundant memory elements using E²PROM devices.

2. Background Art

Bit density of integrated circuit memory devices has been increasing substantially over the past few years. As the bit density increases, the chance for device failure mode increases. Chip layout, inherent technological factors such as oxide failure, and random run-to-run process defect distributions such as broken polysilicon word lines may cause a failure mode of a memory array and its associated row and column decoders.

To overcome faulty memory elements in a device in order to provide yield enhancement, redundant to spare memory elements are included on the chip. Typically, the address of a faulty element is programmed into the spare element by either laser blowing or electrically blowing a polysilicon fuze within the element.

However, the laser blown method requires a special probe machine, special alignment of the laser, passivation opening over the fuze to be cut, re-passivation of the device after the fuze is blown, and a complex testing procedure. The typical electrical blown method requires excessively high power, a passivation opening over the fuze, and re-passivation after the fuze is blown. Both the laser and electrical blown methods could only be used for yield enhancement since they could only be accomplished at the wafer level of the process. The typical methods are only a one time, irreversible process that can not be erased.

Therefore, what is needed is an E²PROM having an in-package electrically programmable redundant memory element that can be programmed and erased in the completed package with lower power.

SUMMARY OF THE INVENTION

Accordingly, it is an object of the present invention to provide an improved electrically programmable redundant memory element.

Another object of the present invention is to provide an electrically programmable redundant memory element that can be programmed in-package.

A further object of the present invention is to provide an electrically programmable redundant memory element that can be erased in-package.

Yet another object of the present invention is to provide an electrically programmable redundant memory element in which passivation openings are not required.

In carrying out the above and other objects of the invention in one form, there is provided an improved electrically programmable redundant memory element having a spare decoder coupled to a row decoder and a spare word line driver coupled to both the spare decoder and row decoder. An address programming element is coupled to the spare decoder, row decoder and spare word line driver, and is responsive to at least two addresses, and is both electrically programmable and electrically eraseable in-package.

The above and other objects, features, and advantages of the present invention will be better understood from the following detailed description taken in conjunction with the accompanying drawings.

DETAILED DESCRIPTION OF THE INVENTION

Figure 1:
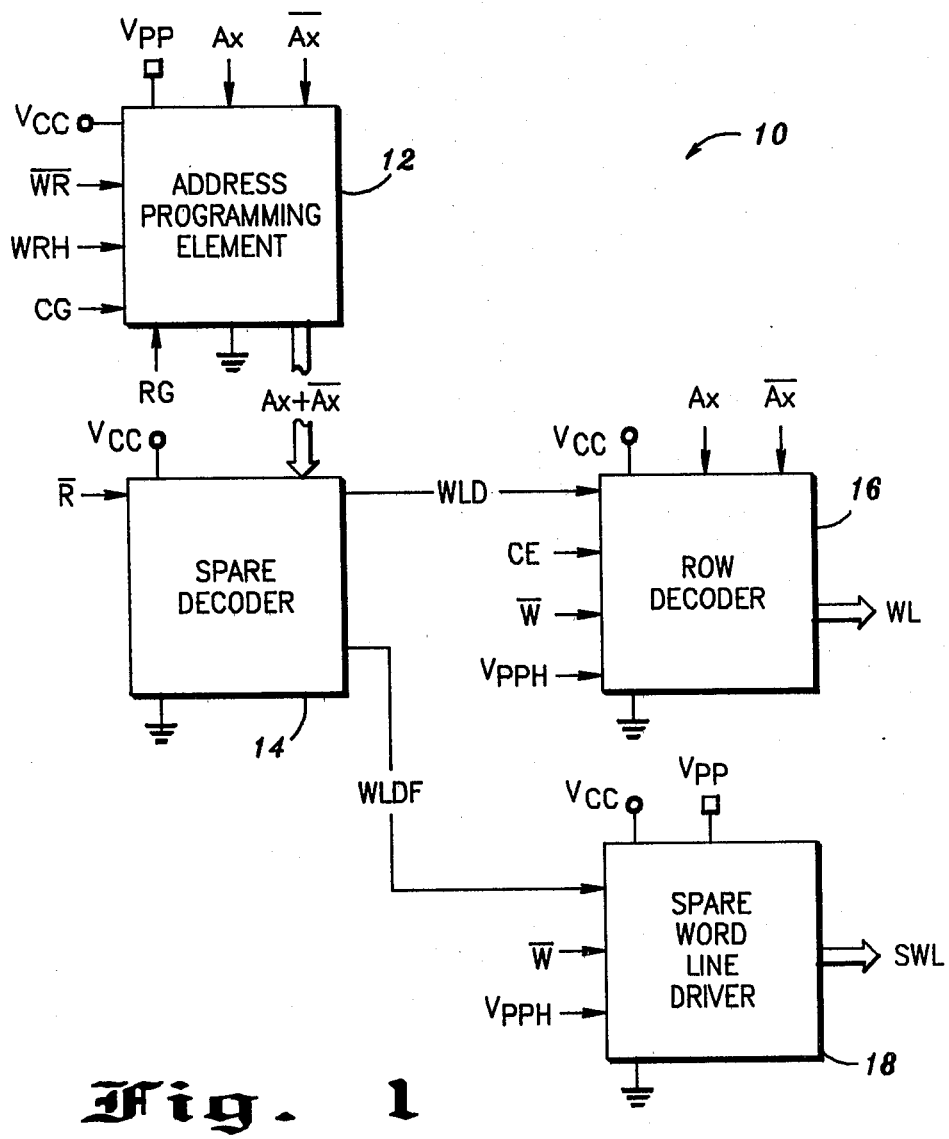
FIG. 1 is a block diagram of the electrically programmable redundant memory element of the present invention.

Referring to FIG. 1, an electrically programmable redundant memory circuit 10 is shown comprising an address programming element 12, a spare decoder 14, a row decoder 16, and a spare word line driver 18. Inputs to the address programming element 12 include addresses Ax and $\overline{Ax}$, write redundancy bar signal $\overline{WR}$, write redundancy high signal WRH, control gate CG, redundancy ground RG, program voltage $V_{PP}$ and supply voltages $V_{CC}$ and ground. The voltage values may differ depending on the circuit device characteristics and are given only as an example and not as a limitation to the scope of the invention. $V_{CC}$ may typically be 5 volts and $V_{PP}$ may be either 21 volts or 5 volts depending on the state desired for the address programming element 12. The output of the address programming element 12 comprises a logic $Ax+\overline{Ax}$ signal and is connected to spare decoder 14.

Only one address programming element 12 is shown, although the electrically programmable redundant memory element 10 would have one such address programming element 12 for each address associated with a decoder. The multiplicity of address programming element 12 outputs to spare decoder 14 are represented by wide arrows.

Inputs to spare decoder 14 include redundancy signal $\overline{R}$ which disables the spare decoder 14 when no redundancy is desired, address programming element 12 output $Ax+\overline{Ax}$ and voltages $V_{CC}$ and ground. Outputs from spare decoder 14 include word line disable WLD, which disables all word lines when redundant memory is selected, and word line disable fast WLDF, which enables the spare word line driver 18, both of which connect spare decoder 14 to row decoder 16 and spare word line driver 18, respectively. Word line disable fast WLDF does not have the capacitive loading of the other word line decoders.

Additional inputs to row decoder 16 include addresses Ax and $\overline{Ax}$, chip enable CE, write bar signal $\overline{W}$, $V_{PP}$ switched signal $V_{PPH}$, and voltages $V_{CC}$ and ground. Outputs from row decoder 16 include word line signals WL.

Additional inputs to spare word line driver 18 include write bar signal $\overline{W}$, $V_{PPH}$ and voltages $V_{PP}$, $V_{CC}$ and ground. Outputs from spare word line driver 18 include spare word lines SWL. Word lines WL and spare word lines SWL select the spare memory element (not shown).

Spare decoder 14, row decoder 16, spare word line driver 18, and the spare memory elements (not shown) are typical devices in memory systems and the operation of each are well known to those skilled in the art. The spare memory elements may be E²PROM devices which can be programmed to replace defective mask programmed ROM or E²PROM.

Figure 2:
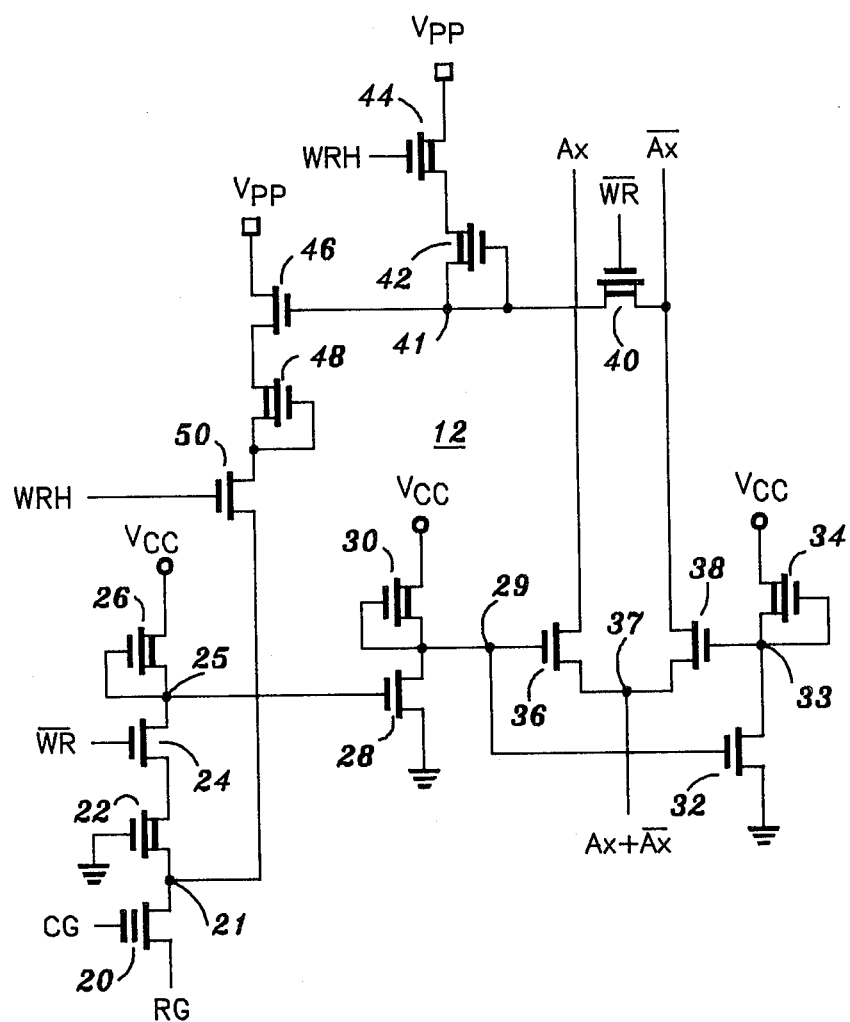
FIG. 2 is a schematic of the address programming element of the present invention.

Referring now to FIG. 2, the address programming element 12 includes a floating gate E²PROM transistor 20 having its gate connected to control gate CG and its source to redundancy ground RG. The drain of transistor 20 is connected to the sources of both transistors 22 and 50. The gate of transistor 22 is connected to ground and the drain is connected to the source of transistor 24, thereby improving data reduction by limiting the drain voltage of transistor 20 to about 2.5 volts. The gate of transistor 24 is connected to write redundancy bar signal $\overline{WR}$ and the drain is connected to the gate and source of transistor 26 and the gate of transistor 28. Transistor 24 provides a method for shutting off the current path between $V_{CC}$ and transistor 20 during programming. The drain of transistor 26 is connected to $V_{CC}$. Transistor 26 determines the sense current for transistor 20. The sense current determines the state of inverter transistors 28 and 30.

Transistor 28 has its source connected to ground and its drain connected to the source of transistor 30 and the gates of transistors 30, 32 and 36. The drain of transistor 30 is connected to $V_{CC}$. Transistors 28 and 30 invert the signal applied to the gate of transistor 28. The source of transistor 32 is connected to ground and the drain is connected to the source of transistor 34 and the gates of transistors 34 and 38. The drain of transistor 34 is connected to $V_{CC}$. Transistors 32 and 34 invert the signal from inverter transistors 28 and 30. The drains of transistors 36 and 38 are connected to addresses Ax and $\overline{Ax}$, respectively. The source of transistors 36 and 38 are interconnected and provide the logic $Ax+\overline{Ax}$ output.

Transistor 40 has its gate connected to the write redundancy bar signal $\overline{WR}$, its drain connected to the address $\overline{Ax}$ and its source connected to the source of transistor 42 and the gates of transistors 42 and 46. The drain of transistor 42 is connected to the source of transistor 44. The gate and drain of transistor 44 are connected to write redundancy high WRH and $V_{PP}$, respectively. The drain and source of transistor 46 are connected to $V_{PP}$ and the drain of transistor 48, respectively. The gate and source of transistor 48 are connected to the drain of transistor 50. The gate of transistor 50 is connected to write redundant high WRH and isolates node 21 from address transitions during the read cycle. Transistor 48 isolates $V_{PP}$ from the programming lines and limits the rise time of the program pulse applied to transistor 20.

When the address programming element 12 is to be programmed to respond to $\overline{Ax}$, a program inhibit mode is established by raising write redundancy high signal WRH to $V_{PP}$, grounding write redundancy bar signal $\overline{WR}$ and address $\overline{Ax}$ so that depletion transistor 40 is conductive and node 41 is grounded thereby turning off transistor 46. Therefore, there will be no voltage at node 21 to program transistor 20.

When transistor 20 is in the unprogrammed or enhancement mode, it draws no current when both control gate CG and redundant ground RG are grounded. Depletion transistor 26 then pulls node 25 to $V_{CC}$. The inverter comprising transistors 28 and 30 is "on", grounding node 29 and the gate of transistor 36. The inverter comprising transistors 32 and 34 is "off" pulling node 33 and the gate of transistor 38 to $V_{CC}$. Thus, transistor 36 is "off" and transistor 38 is "on". Therefore, node 37 is at address $\overline{Ax}$ and is isolated from address Ax.

To program transistor 20, $V_{PP}$ is taken to approximately 21 volts. And zero volts and five volts are placed on addresses Ax and $\overline{Ax}$, respectively. Write redundancy bar $\overline{WR}$ is grounded, write redundant high WRH goes to $V_{PP}$, redundant ground RG goes to $V_{CC}$ and control gate CG is grounded. With its gate grounded and its drain at $V_{CC}$, transistor 40 is turned off. Transistor 44 is turned on bringing node 41 to $V_{PP}$ thereby turning on transistors 46 and 48. Thus, node 21 is at a high voltage (just below $V_{PP}$) thereby programming transistor 20 and changing it from the enhancement to depletion mode.

When transistor 20 is programmed in a depletion mode, node 25 is grounded. The inverter comprising transistors 28 and 30 is "off" and the inverter comprising transistors 32 and 34 is "on" therefore, transistor 36 is "on" and transistor 38 is "off", and node 37 is connected to address Ax and isolated from address $\overline{Ax}$.

To erase the programming in order to place the redundant memory element 10 in its original state, 21 volts is placed on the control gate CG and redundant ground RG is grounded.

By now it should be appreciated that there has been provided an improved electrically programmable redundant memory element. This programmable redundant memory element can be both programmed and erased in package without the necessity of passivation openings in the masking process. It provides a technique for ROM redundancy by replacing faulty ROM with E$^2$PROM.

I claim:

1. A redundant memory circuit having a first and a second address terminal for providing at least one redundant memory element for a plurality of memory elements, comprising:
   a spare decoder coupled to said first and second address terminal;
   a row decoder coupled to said spare decoder for selecting word lines of said plurality of memory elements;
   a spare word line driver coupled to said spare decoder for selecting spare word lines of said plurality of memory elements; and
   programmable means coupled between said spare decoder and said first and second address terminals, for providing an output logically determined from a first address on said first address terminal and a second address on a said second address terminal wherein said programmable means is electronically programmable and electronically erasable in-package.

2. The redundant memory circuit according to claim 1 wherein said programmable means comprises:
   an output means coupled to said first and second address terminals for providing said output;
   programming voltage means coupled to said output means; and
   a floating gate E$^2$PROM device coupled to said programming voltage means and said output means.

3. An address programming element for use in an E$^2$PROM redundant memory circuit having at least two address conductors, a first write signal conductor, a second write signal conductor, a control gate conductor, a redundant ground conductor, and a programming voltage conductor for receiving a programming voltage, comprising:
   programmable means including an E$^2$PROM device having a gate coupled to said control gate conductor, a first current conducting electrode coupled to said redundant ground conductor and a second current conducting electrode switchably coupled to said programming voltage conductor, said programmable means having at least a first and a second state, said first and said second state determined by the application of at least said programming voltage for providing a programmed signal; and output means coupled to said at least two address conductors and said programmable means, and responsive to said programmed signal for providing a logical output.

4. The address programming element according to claim 3 wherein said second current conducting electrode is further switchably coupled to at least one of said at least two address conductors.

5. The address programming element according to claim 4 wherein said output means comprises two differentially coupled transistors responsive to said programming means, for logically combining said at least two address conductors.

6. An address programming element for use in an E²PROM redundant memory circuit having at least two address conductors, a first write signal conductor, a second write signal conductor, a control gate conductor, a redundant ground conductor, a first reference conductor, a second reference conductor and a programming voltage conductor for receiving a programming voltage, comprising:

a floating gate E²PROM device having a gate coupled to said control gate and a first current conducting electrode coupled to said redundant ground conductor;

a first enhancement device having a gate coupled to said second write signal conductor and a first current conducting electrode coupled to a second current conducting electrode of said floating gate E²PROM device;

a first depletion device having a first current conducting electrode coupled to said first reference conductor, and both a gate and a second current conducting electrode coupled to a second current conducting electrode of said first enhancement device;

a first inverter having an input coupled to the second current conducting electrode of said first depletion device, and an output;

a second inverter having an input coupled to said output of said first inverter;

a first differentially connected enhancement device having a gate coupled to said output of said first inverter, a first current conducting electrode coupled to a first address conductor of said at least two address conductors, and a second current conducting electrode coupled to a logical output conductor;

a second differentially coupled enhancement device having a gate coupled to said output of said second inverter, a first current conducting electrode coupled to a second address conductor of said at least two address conductors, and a second current conducting electrode coupled to said logical output conductor;

a second depletion device having a gate coupled to said second write signal conductor, a first current conducting electrode coupled to said second address conductor;

a third depletion device having a gate coupled to said first write signal conductor, a first current conducting electrode coupled to said programming voltage conductor, and a second current conducting electrode coupled to a second current conducting electrode of said second depletion device;

a second enhancement device having a gate coupled to said second current conducting electrode of said third depletion device, a first current conducting electrode coupled to said programming voltage conductor; and a third enhancement device having a gate coupled to said second write signal conductor, a first current conducting electrode coupled to said second current conducting electrode of said second enhancement device, and a second current conducting electrode coupled to said second current conducting electrode of said floating gate E²PROM device.

7. The redundant memory circuit according to claim 1 wherein said programmble means includes at least two address conductors, a first write signal conductor, a second write signal conductor, a control gate conductor, a redundant ground conductor, a first reference conductor, a second reference conductor and a programming voltage conductor for receiving a programming voltage, comprising:

a floating gate E²PROM device having a gate coupled to said control gate and a first current conducting electrode coupled to said redundant ground conductor;

a first enhancement device having a gate coupled to said second write signal conductor and a first current conducting electrode coupled to a second current conducting electrode of said floating gate E²PROM device;

a first depletion device having a first current conducting electrode coupled to said first reference conductor, and both a gate and a second current conducting electrode coupled to a second current conducting electrode of said first enhancement device;

a first inverter having an input coupled to said second current conducting electrode of said first depletion device, and an output;

a second inverter having an input coupled to said output of said first inverter;

a first differentially connected enhancement device having a gate coupled to said output of said first inverter, a first current conducting electrode coupled to a first address conductor of said at least two address conductors, and a second current conducting electrode coupled to a logical output conductor;

a second differentially coupled enhancement device having a gate coupled to said output of said second inverter, a first current conducting electrode coupled to a second address conductor of said at least two address conductors, and a second current conducting electrode coupled to said logical output conductor;

a second depletion device having a gate coupled to said second write signal conductor, a first current conducting electrode coupled to said second address conductor;

a third depletion device having a gate coupled to said first write signal conductor, a first current conducting electrode coupled to said programming voltage conductor, and a second current conducting electrode coupled to a second current conducting electrode of said second depletion device;

a second enhancement device having a gate coupled to said second current conducting electrode of said third depletion device, a first current conducting electrode coupled to said programming voltage conductor; and a third enhancement device having a gate coupled to said second write signal conductor, a first current conducting electrode coupled to said second current conducting electrode of said second enhancement device, and a second current conducting electrode coupled to said second current conducting electrode of said floating gate E²PROM device.

* * * * *